(12) United States Patent
Chan

(10) Patent No.: US 7,839,612 B1
(45) Date of Patent: Nov. 23, 2010

(54) CIRCUITS, ARCHITECTURES, APPARATUSES, SYSTEMS, AND METHODS FOR ESD PROTECTION OF INTEGRATED CIRCUITS HAVING MULTIPLE POWER RAILS

(75) Inventor: Ying Poh Chan, Seri Kembangan (MY)

(73) Assignee: Marvell International Ltd., Hamilton (BM)

( * ) Notice: Subject to any disclaimer, the term of this patent is extended or adjusted under 35 U.S.C. 154(b) by 461 days.

(21) Appl. No.: 11/973,840

(22) Filed: Oct. 9, 2007

Related U.S. Application Data

(60) Provisional application No. 60/828,698, filed on Oct. 9, 2006.

(51) Int. Cl.
*H02H 9/00* (2006.01)
(52) U.S. Cl. ......................................... 361/56
(58) Field of Classification Search ............... 361/56
See application file for complete search history.

(56) References Cited

U.S. PATENT DOCUMENTS 6,671,153 B1 * 12/2003 Ker et al. .................... 361/111
7,245,468 B2 * 7/2007 Griesbach et al. ............. 361/56
2002/0085328 A1 * 7/2002 Liu et al. ...................... 361/56

* cited by examiner

*Primary Examiner*—Robert DeBeradinis
*Assistant Examiner*—Scott Bauer

(57) ABSTRACT

Circuits, systems, and methods for protecting an integrated circuit device having a first power rail and a second power rail from electrostatic discharge (ESD) events. The ESD protection circuit generally comprises an ESD shunt device coupled to the first power rail and a ground potential, a bias circuit configured to provide a bias voltage to the ESD shunt device during a normal mode of operation and to disable the bias voltage during an ESD event on the first power rail, and an isolation circuit configured to isolate the second power rail from the ESD shunt device during the normal mode of operation and to couple the second power rail to the ESD shunt device during an ESD event on the second power rail. The present invention advantageously provides ESD protection that can be shared by independent power supply rails with minimal current leakage through the ESD device, thereby reducing the total number of ESD protection circuits on a mixed supply integrated circuit device.

26 Claims, 9 Drawing Sheets

CIRCUITS, ARCHITECTURES, APPARATUSES, SYSTEMS, AND METHODS FOR ESD PROTECTION OF INTEGRATED CIRCUITS HAVING MULTIPLE POWER RAILS

RELATED APPLICATIONS

This application claims the benefit of U.S. Provisional Application No. 60/828,698, filed Oct. 9, 2006, incorporated herein by reference in its entirety.

FIELD OF THE INVENTION

The present invention generally relates to the field of electrostatic discharge (ESD) protection. More specifically, embodiments of the present invention pertain to circuits, architectures, systems, and methods for ESD protection of integrated circuits having multiple power rails.

DISCUSSION OF THE BACKGROUND

It is generally recognized that integrated circuits are susceptible to damage from electrostatic discharge (ESD). Such damage generally occurs when current and/or voltage ratings of devices in an integrated circuit are exceeded.

Progress in VLSI technology today has resulted in smaller and smaller integrated circuit geometries in integrated circuits. With scaled-down device dimensions, shallow junction depths, thinner gate oxides, lightly doped drain (LDD) structures, and the use of salicide process technology, integrated circuits generally become more susceptible to ESD damage. This becomes more severe when the integrated circuit consists of multiple independently-powered circuit sections (e.g., sections of the integrated circuit having isolated power rails). For example, both externally-applied DC and alternating current (AC) power sources are configured to provide a nominal power supply, or standard voltage, to an integrated circuit (IC) for its operation. On occasion, these power sources may pass to the IC transient or sustained voltages that are significantly above nominal level. In addition, human handlers and/or electronic equipment may carry or generate a significant static electrical charge, sometimes on the order of a thousand to two thousand volts or more. For example, when a human handler inadvertently touches the leads of an IC and passes such a high static charge to an input buffer on the IC, significant (and sometimes fatal) damage can be done to the IC if the IC is without some kind of protection against such ESD.

The Human Body Model (HBM) is a commonly used model for characterizing the susceptibility of an electronic device to damage from ESD. The model is a simulation of the discharge which might occur when a human touches an electronic device. The Machine Model (MM) is an alternative ESD model representing a discharge similar to the HBM event from a charged conductive object, such as a metallic tool or fixture. The Charged Device Model, in contrast, represents a transfer of charge from an ESD protection device. A CDM event can be more destructive than an HBM event for some devices. Although the duration of the discharge is very short (e.g., often less than one nanosecond) the peak current can reach several tens of amperes. Generally, the ESD robustness of integrated circuit devices should exceed 2 kV for HBM ESD events, 200V for MM events, and/or 500V for CDM events. It is often desirable to design integrated circuits that can satisfy these requirements with some margin of safety.

In advanced VLSI integrated circuit devices, power lines may be separated to avoid noise coupling and to reduce ground bouncing for high-performance circuit operation. In addition, an integrated circuit device may have multiple power supplies for different types of input and/or output (I/O) signals. These supplies could be at different voltage levels. For example, a CMOS I/O may operate at 3.3 v, a double data rate (DDR) RAM I/O may operate at 2.5 v, and a low voltage differential signaling (LVDS) I/O may operate at 1.8 v. Conventionally, a separate ESD protection device is provided for each power rail.

Referring now to FIG. 1, an integrated circuit 100 having independent power supply rails 111 and 121 is shown. Power supply rail 111 may operate at 3.3 v and have a first ESD clamp 112. Power supply rail 121 may operate at 1.8 v and have a second ESD clamp 122. ESD clamps 112 and 122 may comprise one or more of a silicon-controlled rectifier (SCR), an RC-triggered shunt, a stacked diode, a breakdown MOSFET, or any other ESD clamp device known in the art.

Referring now to FIG. 2A, a conventional RC-triggered shunt device 200 is shown. During an ESD event, the RC circuitry generally pulls the intermediate node 203 low and in turn biases the gate of transistor 202. Transistor 202 is typically an NMOS device having total device width (W) of more than 1000 μm. When the gate of transistor 202 is biased at a voltage above a certain threshold, the transistor will turn on and create a short between power lines 210 and 211 to shunt the ESD current. Many factors must be considered when designing an RC-triggered shunt circuit. The combination of resistor 201 and capacitor 204 generally determines the period during which the RC shunt will be active during an ESD event. However, resistor 201 and capacitor 204 must also be selected such that, during normal operation (e.g., in the absence of an ESD event), the voltage at node 203 is high enough to keep inverter 205 tied low, so that transistor 202 remains turned off. Typical RC shunt delays are in the range of 1 to 5 micro-seconds (μs). The delay has much different magnitude from the rate of power ramping, which usually falls in the millisecond (ms) range. Accordingly, a circuit designer would not configure the RC shunt to have a delay near the millisecond range, to avoid a false triggering of the RC shunt device during a ramp of the power supply. Furthermore, in inverter 205 a PFET transistor 206 is generally much larger than the NFET transistor 207, in order to facilitate fast activation of the shunt device 200 when an ESD event occurs.

Another conventional ESD shunt device is the stacked diode chain. Referring now to FIG. 2B, diode chain 220 is shown. Diode chain 220 includes a plurality of diodes (e.g., diodes 221, 222, and 223) connected in series. The diodes in a diode chain are implemented with diode-connected transistors. Referring now to FIG. 2C, a diode chain 220' is shown, comprising diode-connected transistors 221', 222', and 223'. Diode-connected transistors 221', 222', and 223' are PNP-based transistors. More specifically, transistors 221', 222', and 223' may be connected as P+/N-well diodes. Because diodes are susceptible to noise, the diode chains 220 and 220' might be triggered after a temperature or other operational variation. Therefore, diode chain-based ESD clamp devices are usually designed with a safe margin between the turn-on (e.g., ESD activation) voltage and the maximum operating voltage of the circuit to be protected. Diode chain 220' is also subject to current leakage during normal operation. For example, when diode-connected transistor 221' is turned on, there is a collector current $I_{leak}$ that flows to substrate 225.

Therefore, proper care must be taken to limit the total current leakage in order to prevent circuit malfunctions and to reduce the total power consumed by the integrated circuit device.

With the conventional approach (e.g., where a separate ESD clamp is provided for each power rail, as shown in FIG. 1), the number of ESD clamp devices increases somewhat dramatically as the number of isolated and/or different power supply rails increases. In addition, ESD protective structures may consume a relatively substantial portion of a semiconductor die that is manufactured using modern manufacturing processes (e.g., 0.13 μm, 90 nm, 65 nm, etc.). Thus, larger structures such as ESD clamps may be relatively more expensive to produce in a smaller manufacturing process than in an older manufacturing process (e.g., 0.18 μm, 0.25 μm, etc.).

Therefore, it would be desirable to provide an ESD protective device that can be shared by independent power supply rails, while also limiting the amount of leakage current, thereby reducing the total number of ESD protective devices in and/or on a mixed supply voltage integrated circuit device.

SUMMARY

Embodiments of the present invention relate to circuits, systems, and methods for protecting an integrated circuit device from electrostatic discharge (ESD) events, where the integrated circuit device has a first power rail and a second power rail. The ESD protection circuit generally comprises an ESD shunt device coupled to the first power rail and a ground potential, a bias circuit configured to provide a bias voltage to the ESD shunt device during a normal mode of operation and to disable the bias voltage during an ESD event on the first power rail, and an isolation circuit configured to isolate the second power rail from the ESD shunt device during the normal mode of operation and to couple the second power rail to the ESD shunt device during an ESD event on the second power rail.

In one embodiment, the ESD shunt device comprises a plurality of diodes connected in series. For example, the diodes may comprise P+/N-well diodes. In a further embodiment, the plurality of diodes comprises a first series of diodes (e.g., a string, stack, chain, or other plurality of diodes connected serially) and a second series of diodes, the first power rail is coupled to an input node of the first series of diodes, an output node of the first series of diodes is coupled to an input node of the second series of diodes at an internal node of the ESD shunt device, and an output node of the second series of diodes is coupled to the ground potential.

In a still further embodiment, the bias circuit is configured to provide the bias voltage to the internal node of the ESD shunt device. In an exemplary embodiment, the bias circuit comprises a bias transistor, a first resistor coupled to the first power rail and to a gate of the bias transistor, and a first capacitor coupled to the gate of the bias transistor and to a ground potential. In a further embodiment, the bias transistor comprises a first source/drain region coupled to the second power rail and a second source/drain region coupled to the internal node of the ESD shunt device.

In another exemplary embodiment, the isolation circuit is further configured to couple the second power rail to the internal node of the ESD shunt device during an ESD event on the second power rail. In a further embodiment, the isolation circuit comprises an isolation transistor, an inverter having an output coupled to a gate of the isolation transistor, a second resistor coupled to the second power rail and to an input of the inverter, and a second capacitor coupled to the input of the inverter and to a ground potential. In a still further embodiment, the isolation transistor comprises a first source/drain region coupled to the second power rail and a second source/drain region coupled to the internal node of the ESD shunt device.

The architectures and/or systems generally comprise those that include a circuit embodying one or more of the inventive concepts disclosed herein. For example, in one embodiment of an integrated circuit device according to the present invention, the integrated circuit device comprises the above described ESD protection circuit, the first power rail, and the second power rail. In a further embodiment, the integrated circuit device further comprises a first power rail terminal coupled to the first power rail and a second power rail terminal coupled to the second power rail (e.g., the terminals may comprise bond pads, ball bonds, or other structures for coupling the power rails to external power supplies and/or signals). In a still further embodiment, the first power rail terminal is coupled to a first external power supply and the second power rail terminal is coupled to a second external power supply.

In yet another embodiment, the second external power supply has a different voltage from the first external power supply. The voltage of the first power supply is generally greater than the voltage of the second power supply. In one exemplary embodiment of the integrated circuit device, the first power rail has a voltage potential of approximately 3.3 v during the normal mode of operation and the second power rail has a voltage potential of approximately 1.8 v during the normal mode of operation. In alternative embodiments, the first and second power supplies may have voltage potentials of 9.0 v, 5.0 v, 2.5 v, or any other appropriate voltage.

The method of protecting an integrated circuit device from electrostatic discharge (ESD) events generally comprises the steps of providing a bias voltage to an ESD shunt device during a normal mode of operation, during an ESD event on the first power rail disabling the bias voltage and shunting ESD current from the first power rail through the ESD shunt device, isolating the second power rail from the ESD shunt device during the normal mode of operation, and, during an ESD event on the second power rail, electrically coupling the second power rail to the ESD shunt device and shunting ESD current from the second power rail through the ESD shunt device.

In a further embodiment, the method includes detecting the ESD event on the first power rail and disabling the bias voltage in response to the ESD event. In another embodiment, the ESD shunt device comprises a plurality of diodes connected in series. For example, the diodes may comprise P+N-well diodes. In yet another embodiment, the plurality of diodes comprises a first series of diodes and a second series of diodes, the first power rail is coupled to an input node of the first series of diodes, an output node of the first series of diodes is coupled to an input node of the second series of diodes at an internal node of the ESD shunt device, and an output node of the second series of diodes is coupled to a ground potential.

In another embodiment, providing the bias voltage comprises applying the bias voltage to the internal node of the ESD shunt device. In still another embodiment, electrically coupling the second power rail to the ESD shunt device comprises electrically coupling the second power rail to the internal node of the ESD shunt device. An embodiment of the method may further includes the step of detecting the ESD event on the second power rail and electrically coupling the power second power rail to the ESD shunt device in response to the ESD event.

Another embodiment relates to an apparatus for electrostatic discharge protection having means for shunting an ESD current from a first power rail and/or a second power rail to a ground potential, means for biasing the means for shunting during a normal mode of operation and for disabling the biasing during an ESD event on the first power rail, and means for isolating the second power rail from the means for shunting during the normal mode of operation. The apparatus may further comprise means for detecting the ESD event on the first power rail and means for disabling the bias voltage in response to the detecting.

In another embodiment, the means for biasing includes means for biasing the means for shunting at an internal node of the means for shunting. Yet another embodiment further comprises means for coupling the second power rail to the means for shunting during an ESD event on the second power rail. In a further embodiment, the means for coupling comprises means for electrically coupling the second power rail to an internal node of the means for shunting. In still another embodiment, the apparatus further comprises means for detecting the ESD event on the second power rail and means for electrically coupling the second power rail to the means for shunting in response to the detecting.

The present invention advantageously provides ESD protection that can be shared by independent power supply rails with minimal current leakage through the ESD device, thereby reducing the number of ESD devices in and/or on an integrated circuit device. These and other advantages of the present invention will become apparent from the detailed description of embodiments below.

DETAILED DESCRIPTION

Reference will now be made in detail to embodiments of the invention, examples of which are illustrated in the accompanying drawings. While the invention will be described in conjunction with the embodiments, it will be understood that they are not intended to limit the invention to these embodiments. On the contrary, the embodiments of the invention are intended to cover alternatives, modifications, and equivalents that may be included within the spirit and scope of the appended claims. Furthermore, in the following detailed description of the embodiments of the present invention, numerous specific details are set forth in order to provide a thorough understanding of the present invention. However, it will be readily apparent to one skilled in the art that embodiments of the present invention may be practiced without these specific details. In other instances, well-known methods, procedures, components, and circuits have not been described in detail so as not to unnecessarily obscure aspects of embodiments of the present invention.

For the sake of convenience and simplicity, the terms "connected to," "coupled with," "coupled to," and "in communication with" (which terms also refer to direct and/or indirect relationships between the connected, coupled and/or communication elements unless the context of the term's use unambiguously indicates otherwise) may be used interchangeably, but these terms are also generally given their art-recognized meanings.

The embodiments of the invention, in its various aspects, will be explained in greater detail below.

An Exemplary Circuit

Figure 3:
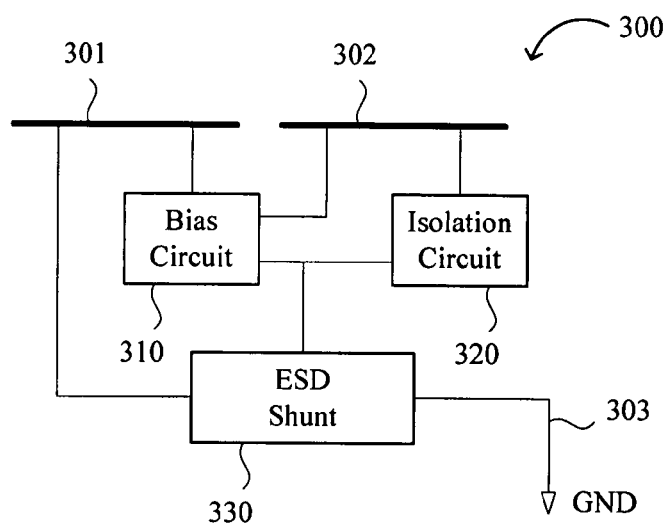
FIG. 3 is a diagram showing an ESD protection circuit according to an embodiment of the present invention.

Referring now to FIG. 3, an exemplary ESD protection circuit 300 is shown. ESD shunt device 330 is coupled to first power rail 301 and ground 303. Bias circuit 310 is configured to provide a bias voltage to the ESD shunt device 330 during a normal mode of operation and to disable the bias voltage during an ESD event on the first power rail 301. Isolation circuit 320 is configured to isolate the second power rail 302 from the ESD shunt device 330 during the normal mode of operation and to couple the second power rail 302 to the ESD shunt device 330 during an ESD event on the second power rail 302.

Figure 1:
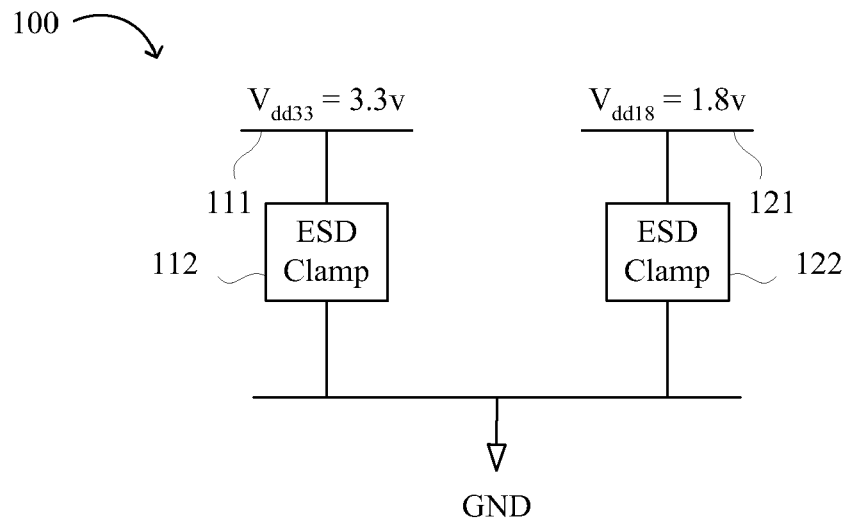
FIG. 1 is a diagram showing an integrated circuit with ESD protection devices.
Figure 2A:
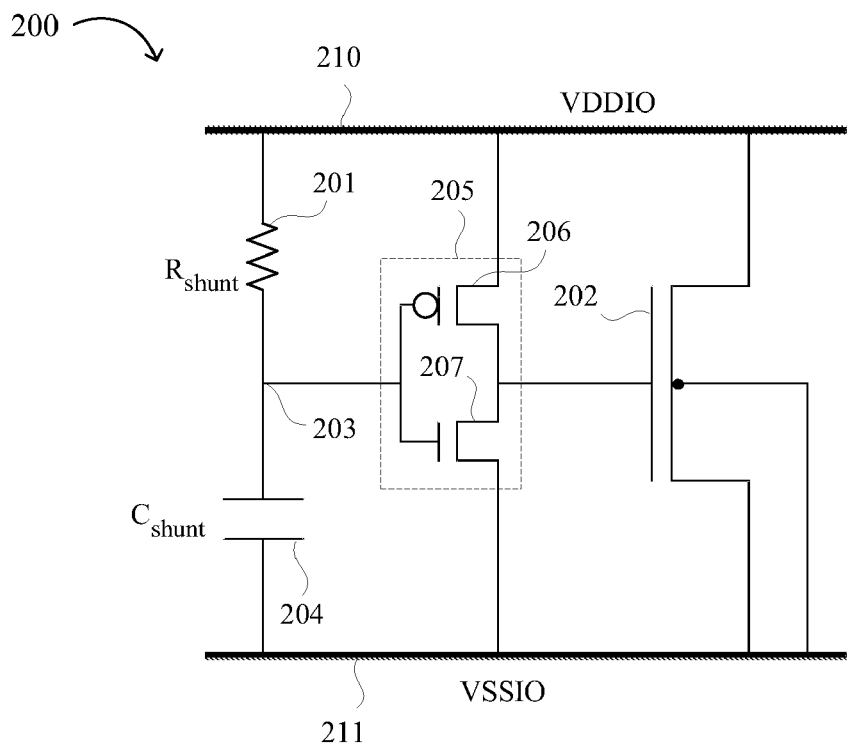
FIG. 2A is a diagram showing a diode series ESD shunt device.
Figure 2B:
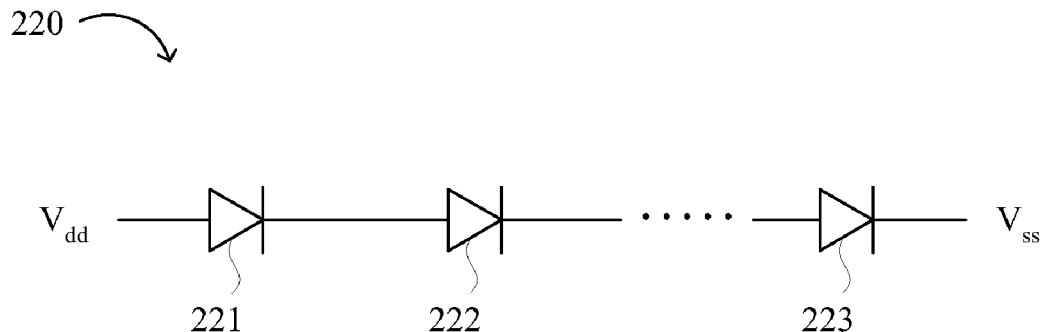
FIG. 2B is a diagram showing a diode series ESD shunt device having P+/N-well diodes.
Figure 2C:
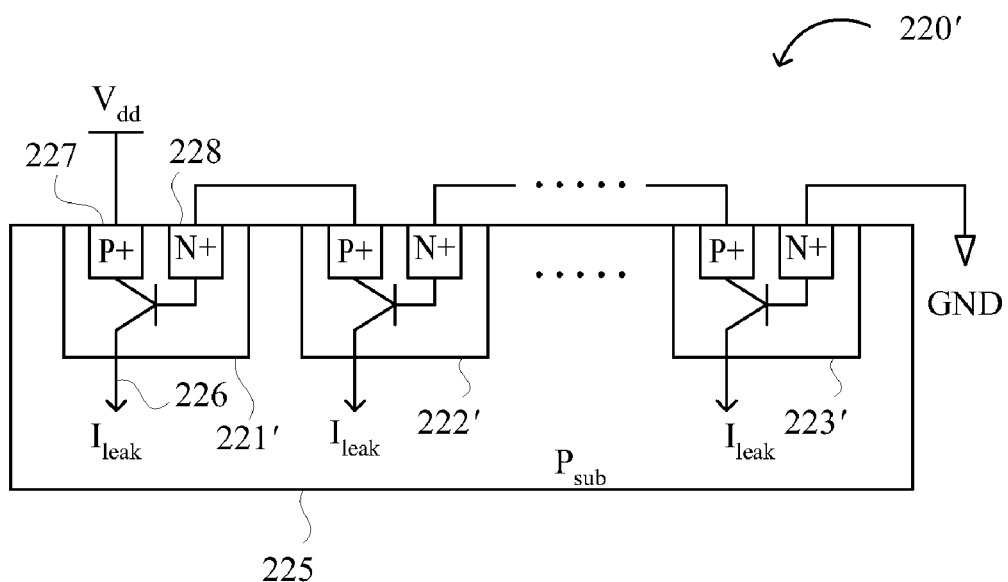
FIG. 2C is a diagram showing a chain of P+/N-well diode-connected transistors.
Figure 4A:
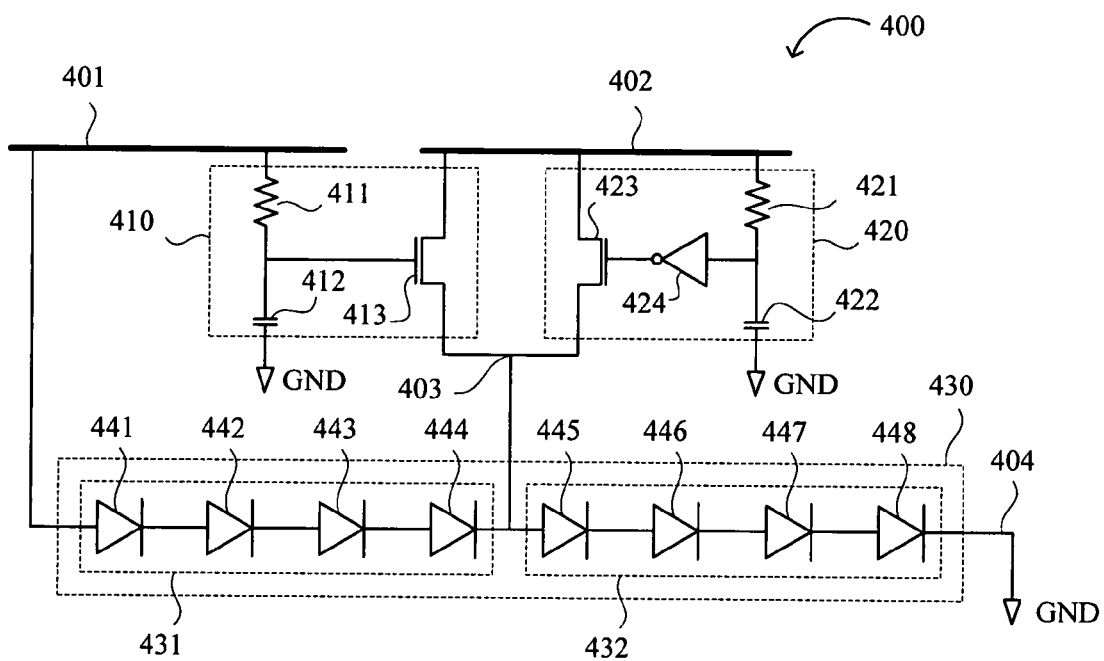
FIG. 4A is a diagram showing an embodiment of the present ESD protection circuit.

Referring now to FIG. 4A, a detailed ESD protection circuit 400 is shown. Exemplary bias circuit 410 generally corresponds to bias circuit 310 of FIG. 3. Exemplary isolation circuit 420 generally corresponds to isolation circuit 320 of FIG. 3. ESD shunt device 430 generally corresponds to ESD shunt device 330 of FIG. 3. Shunt device 430 comprises 8 diodes 441 to 448 connected in series. The diodes may, for example, comprise a chain of P+/N-well diode-connected transistors, as shown in FIG. 2C. Shunt device 430 is divided into first diode series 431 comprising diodes 441 to 444 and second diode series 432 comprising diodes 445 to 448. First power rail 401 is coupled to an input node for first diode series 431. The output of diode series 431 is coupled to the input of second diode series 432 at internal node 403. The output of diode series 432 is coupled to ground 404. In alternative embodiments, bias circuit 410 may be coupled to a different middle node of shunt device 430 than isolation circuit 420, depending on the ESD protection characteristics required for the respective first and second power rails.

Each diode 441 to 444 has a characteristic "cut-in" or "turn-on" voltage. Due to collector current leakage to the substrate and smaller base current available to trigger each succeeding diode in the diode series, when the diodes are connected in series, the total cut-in voltage $V_{STRING}$ of the diode series can be calculated according to the equation:

$$V_{STRING} = mV_0 - nV_T \times \left(\frac{m(m-1)}{2}\right) \times \ln(\beta + 1), \quad \text{(EQ. 1)}$$

wherein $V_0$ is the forward turn-on voltage of each diode, $V_T$ is thermal voltage of each diode, n is the ideality factor of each diode, $\beta$ is the beta gain of the parasitic PNP transistor, and m is the number of stacked diodes.

In one exemplary embodiment, first power rail 401 has a nominal voltage of 3.3 v and second power rail 402 has a nominal voltage of 1.8 v. However, a person skilled in the art may design an ESD protection device according to the present invention for any combination of power rail voltages (e.g., power rail voltages of 9.0 v, 5.0 v, 3.3 v, 2.5 v, 1.8 v, or any other appropriate supply voltage). This embodiment is generally most advantageous where the first power rail has a voltage that is higher than the second power rail.

The path from first power rail 401 to ground 404 comprises all eight diodes 441 to 448 in both first diode series 431 and second diode series 432. The series of 8 diodes 441 to 448 requires more than 5 v to be turned on (e.g., to begin conducting current from first power rail 401 to ground 404, assuming that the cut-in voltage loss of this chain is 0.6 v). The path from second power rail 402 to ground 404 comprises the four diodes 445 to 448 of second diode series 432. Thus, second diode series would require voltage above 2.5 v to be turned on, assuming that the cut-in loss is 0.3 v. Generally, selection of the number of diodes, the turn-on voltage, and the cut-in loss of each of the diode series' depending on the ESD protection characteristics desired for the first and second power rails is well within the ability of one skilled in the art.

Bias circuit 410 is configured to provide a bias voltage to the internal node 403 of ESD shunt device 430 during a normal mode of operation and to disable the bias voltage during an ESD event on the first power rail 401. Bias circuit 410 comprises transistor 413, resistor 411, and capacitor 412. Resistor 411 is coupled to the first power rail 401 and to the gate of transistor 413. Capacitor 412 is coupled to the gate of the bias transistor and to a ground potential (e.g., ground 404). One source/drain region of transistor 413 is coupled to the second power rail 402, and a second source/drain of transistor 413 is coupled to the internal node 403 of ESD shunt device 430.

If voltage of first power rail 401 is 3.3 v and the turn-on voltage of shunt device 430 (e.g., the combination of first diode series 431 and second diode series 432) is above 5 v, as described above, then during normal operation the voltage on first power rail is insufficient to turn on shunt device 430. In addition, through resistor 411 and capacitor 412 the gate of transistor 413 would be raised high. Therefore, transistor 413 will be turned on and a bias voltage will be applied to internal node 403 of shunt device 430. If second power rail 402 has an operating voltage of 1.8 v and transistor 413 has a threshold voltage of 0.4 v, then transistor 413 will provide a bias voltage of 1.4 v to internal node 403 during normal operation. Thus, the bias voltage of 1.4 v will be insufficient to turn on second diode series 432 (which, as described above, has a turn-on voltage of 2.5 v in this embodiment). Therefore, during normal operation both first diode series 431 and second diode series 432 will be in an OFF state and no collector current leakage will be produced by ESD shunt device 430.

Isolation circuit 420 is configured to isolate the second power rail 402 from the ESD shunt device 430 during the normal mode of operation and to couple the second power rail 402 to the internal node 403 of ESD shunt device 430 during an ESD event on the second power rail 402. Isolation circuit 420 comprises a transistor 423, an inverter 424, a resistor 421, and a capacitor 422. Inverter 424 has an output coupled to the gate of the transistor 423. Resistor 421 is coupled to the second power rail 402 and to the input of inverter 424. Capacitor 422 is coupled to the input of inverter 424 and to a ground potential (e.g., ground 404). Transistor 423 has a first source/drain region coupled to the second power rail 402 and a second source/drain region coupled to the internal node 403 of the ESD shunt device 420.

When an ESD event occurs on the first power rail 401, shunt device 430 needs to turn on to clamp the voltage to a safe level. An ESD event is a high current event and all eight diodes 441 to 448 in shunt device 430 will turn on and shunt the current to ground 404. At the same time, through resistor 411 and capacitor 412, transistor 413 will be turned off when its gate is pulled low. Assuming that there is no simultaneous ESD event on second power rail 402, resistor 421 and capacitor 422 will combine to pull the input of inverter 424 high, thereby turning off transistor 423. Thus, during an ESD event on first power rail 401, no bias current will be applied to internal node 403 of shunt device 430. If internal node 403 were still biased, the effectiveness of the shunt device 430 during the ESD event might be compromised. In the embodiment described herein with respect to FIG. 4A, the effective clamped voltage of shunt device 430 for first power rail 401 is approximately 5 to 6 v.

When an ESD event occurs on second power rail 402, resistor 421 and capacitor 422 combine to pull the input of inverter 424 low, thereby turning on transistor 423. This allows the ESD current to flow to the internal node 403 of shunt device 430 through second diode series 432 to ground 404. In the embodiment described herein with respect to FIG. 4A, the effective clamped voltage of second diode series 432 for second power rail 402 is approximately 3 to 4 v.

When an ESD event occurs on both the first power rail 401 and the second power rail 402, shunt device 430 needs to turn on to clamp the voltage to a safe level on both rails. The ESD on the first power rail will turn off transistor 413 by pulling its gate low through resistor 411 and capacitor 412. However, the ESD event on second power rail 402 will cause resistor 421 and capacitor 422 combine to pull the input of inverter 424 low, thereby turning on transistor 423. Thus, ESD current will be allowed to flow from the second power rail 402 to the internal node 403 of shunt device 430 through second diode series 432 to ground 404, while ESD current from the first power rail 401 will also be allowed to flow through shunt device 430 to ground 404. Therefore, if the ESD shunt device is to be designed to handle simultaneous ESD events on both power rails 401 and 402, then ate least diode series 432 should be sized to handle the combined shunt currents.

A person skilled in the art will recognize that the exemplary ESD shunt device of the present invention may comprise a distributed device, and that additional similar shunt devices (e.g., additional diode series) in parallel could also be activated to conduct an ESD current during an ESD event. Therefore, if the performance of one single ESD shunt device according to the present is insufficient to dissipate anticipated ESD currents, then additional devices can be added to increase the robustness of the circuit.

A person skilled in the art will also recognize that transistor 423 is part of the ESD path when an ESD event occurs on second power rail 402. Therefore, transistor 423 is preferably treated and/or designed as an ESD device, and ESD design guidelines should be applied. For example, using 0.13 μm design rules, transistor 423 may have a minimum width of 20 μm and a minimum length of 0.4 μm, appropriate guard-ring protection, good contact and via connection(s), adequate metal routing, well configured drain contact to polysilicon spacing, etc.

An Exemplary Integrated Circuit Device

Figure 4B:
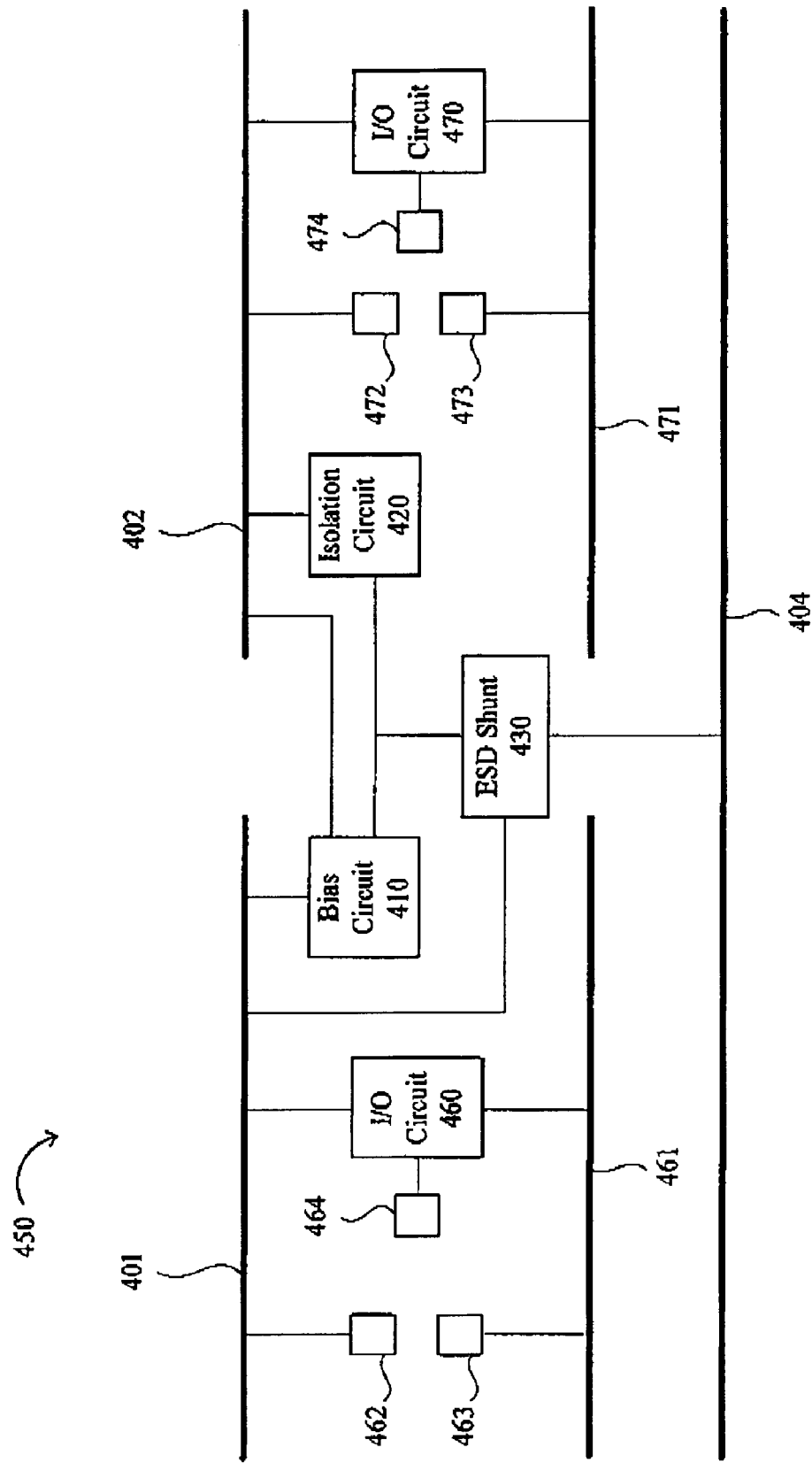
FIG. 4B is a diagram showing an integrated circuit device having ESD protection according to an embodiment of the present invention.

Referring now to FIG. 4B, a block diagram of an exemplary integrated circuit device 450 is shown. Integrated circuit device 450 has first power rail 401, second power rail 402, global ground rail 404, bias circuit 410, isolation circuit 420, and ESD shunt device 430, all of which function generally as described with respect to FIG. 4A, above. Integrated circuit device also has I/O circuits 460 and 470 coupled to I/O terminals 464 and 474, respectively, and power rail terminals 462, 463, 472, and 473. Power rail terminals 462 and 463 are coupled to first independent positive power rail (e.g., a VDD rail) 401 and first independent negative power rail (e.g., a VSS rail) 461, respectively. Power rail terminals 472 and 473 are coupled to second independent positive power rail 402 and second independent negative power rail 471, respectively. Terminals 462-464 and 472-474 may comprise bond pads, ball bonds, or other structures for coupling the power rails and/or I/O circuits to external power supplies and/or signals. For example, the first power rail terminals 462 and 463 may be coupled to a first external power supply (e.g., a 3.3 v external power supply) and the second power rail terminals 472 and 473 may be coupled to a second external power supply (e.g., a 1.8 v external power supply). I/O circuits 460 and 470 may comprise, for example, input buffers, output drivers, RC circuits, or other I/O circuits as are known in the art. I/O circuits 460 and 470 may be input-only circuits, out-only circuits, or both input and output circuits.

An Exemplary Method

Figure 5:
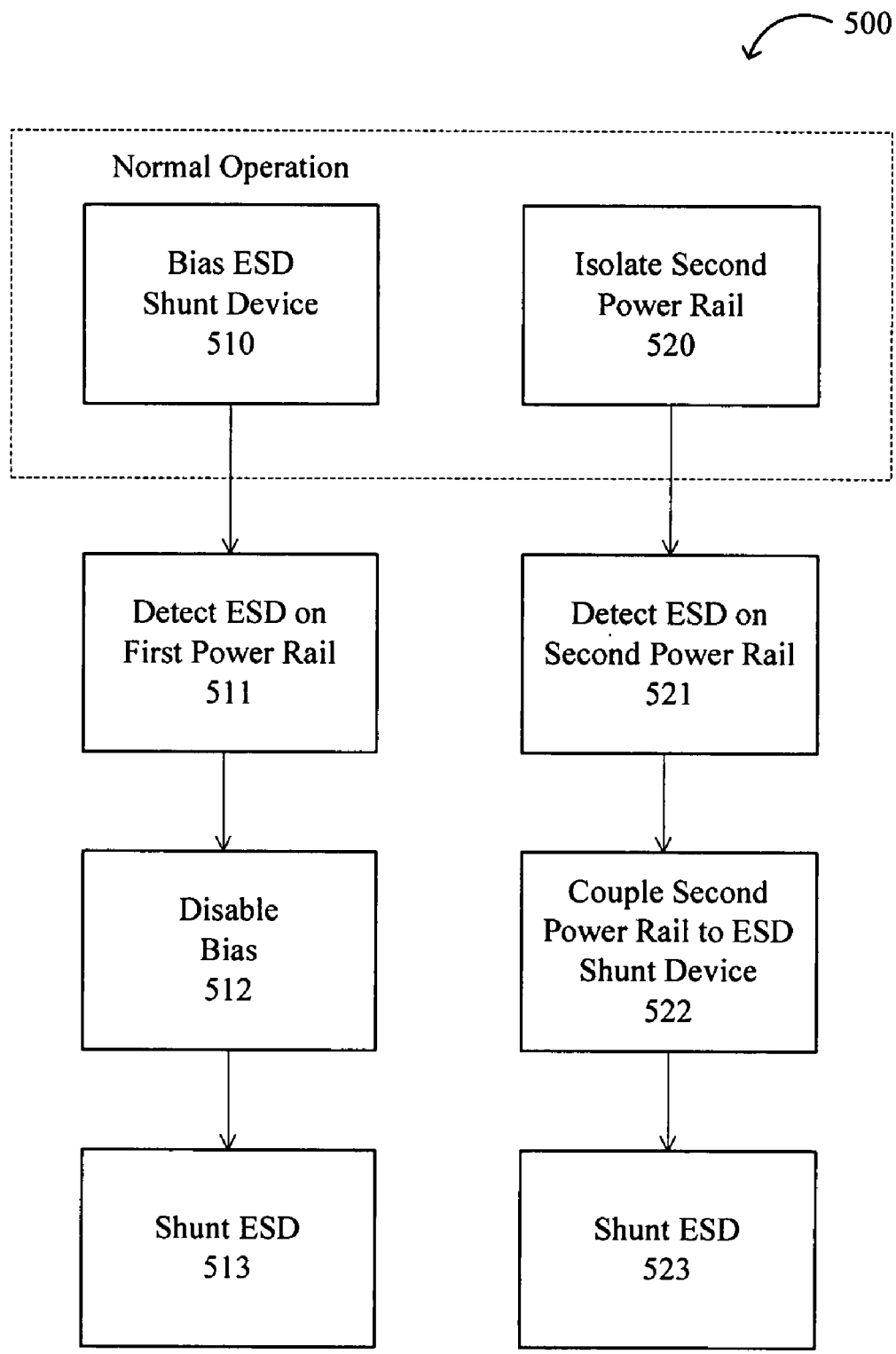
FIG. 5 is a diagram showing a method of ESD protection according to an embodiment of the present invention.

Referring now to FIG. 5, a flow chart 500 showing an exemplary method of protecting an integrated circuit device from electrostatic discharge (ESD) events is shown. During a normal mode of operation, at step 510 includes providing a bias voltage to an ESD shunt device and step 520 includes isolating the second power rail from the ESD shunt device. During an ESD event on the first power rail, step 511 includes detecting the ESD event. At step 512, the bias on the shunt device is disabled in response to detecting step 511, and at step 513 the ESD current is shunted from the first power rail through the ESD shunt device to a ground potential. During an ESD event on the second power rail, step 521 includes detecting the ESD event. At step 522, the second power rail is coupled to the ESD shunt device in response to the detecting step 521, and at step 523 the ESD current is shunted from the second power rail through the ESD shunt device to a ground potential.

Referring again to FIG. 4A, bias circuit 410 generally performs step 510 by providing a bias voltage to the internal node 403 of ESD shunt device 430 during a normal mode of operation. When an ESD event occurs on first power rail 401, step 511 of detecting the event occurs when resistor 411 and capacitor 412 combine to pull the gate of transistor 413 low. As a result, at step 512, transistor 413 will be turned off, thereby disabling the bias provided to ESD shunt device 430 at internal node 403. With the bias voltage disabled, ESD shunt device 430 can more effectively shunt the ESD current from first power rail 401 to ground 404 at step 513.

Isolation circuit 420 generally performs step 520 by isolating the second power rail 402 from the ESD shunt device 430 during the normal mode of operation. When an ESD event occurs on second power rail 402, step 521 of detecting the ESD even occurs when resistor 421 and capacitor 422 combine to pull the input of inverter 424 low. As a result, at step 522, transistor 423 will be turned on. Thus, at step 523 the ESD current is shunted through transistor 423 to the internal node 403 of shunt device 430, through second diode series 432, and finally to ground 404.

Exemplary Systems

Figure 6A:
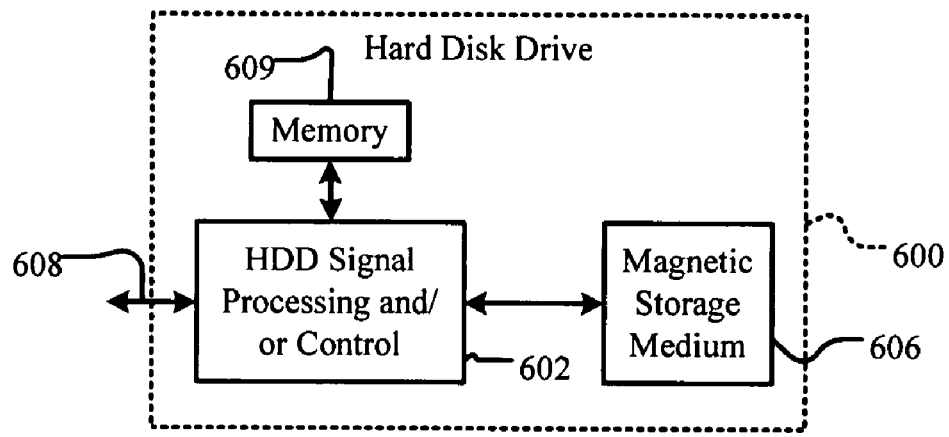
FIG. 6A is a diagram of an exemplary hard disk drive.

The integrated circuits incorporating the ESD protection described herein can be implemented in various exemplary systems, as described below. Referring now to FIG. 6A, for example, embodiments of the present invention can be implemented as part of a hard disk drive 600 (or control unit therefor). The embodiments of the present invention may further contain signal processing and/or control circuits, generally identified in FIG. 6A at 602. In some implementations, the signal processing and/or control circuit 602 and/or other circuits in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular phones, media or MP3 players and the like, and/or other devices via one or more wired or wireless communication links 608. The HDD 600 may be connected to memory 609 such as random access memory (RAM), nonvolatile memory such as flash memory, read only memory (ROM), and/or other suitable electronic data storage.

Figure 6B:
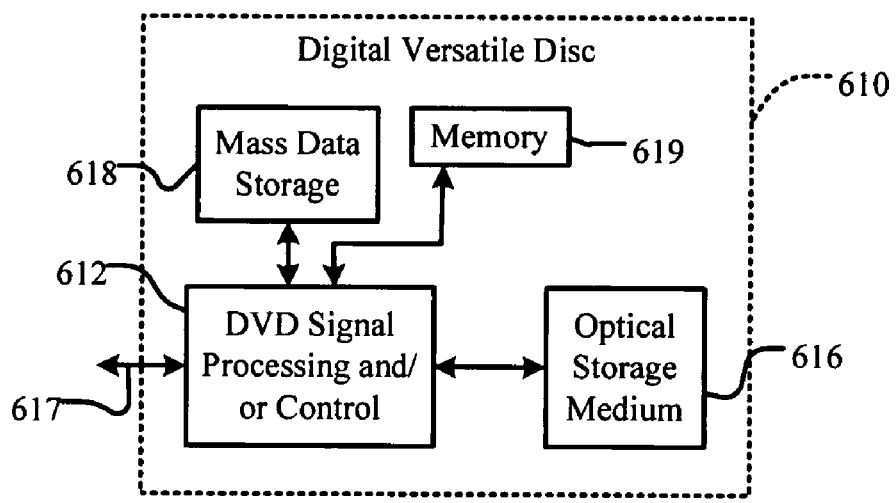
FIG. 6B is a diagram of an exemplary digital versatile disc (DVD) player.

Referring now to FIG. 6B, the present invention can be implemented in an IC for a digital versatile disc (DVD) drive 610. ICs according to the present invention may further include either or both signal processing and/or control circuits, which are generally identified in FIG. 6B at 612. The signal processing and/or control circuit 612 and/or other circuits (not shown) in the DVD may process data, perform coding and/or encryption, perform calculations, and/or format data that is read from and/or data written to an optical storage medium 616. In some implementations, the signal processing and/or control circuit 612 and/or other circuits (not shown) in the DVD 610 can also perform other functions such as encoding and/or decoding and/or any other signal processing functions associated with a DVD drive.

The DVD drive 610 may communicate with an output device (not shown) such as a computer, television or other device via one or more wired or wireless communication links 617. The DVD 610 may communicate with a mass data storage 618 that stores data in a nonvolatile manner. The mass data storage 618 may include a hard disk drive (HDD), such as the HDD 600 shown in FIG. 6A. The HDD may also be or comprise a mini HDD that includes one or more platters having a diameter that is smaller than approximately 1.8". The DVD may be connected to a memory 619 such as RAM, ROM, nonvolatile memory such as flash memory and/or other suitable electronic data storage.

Figure 6C:
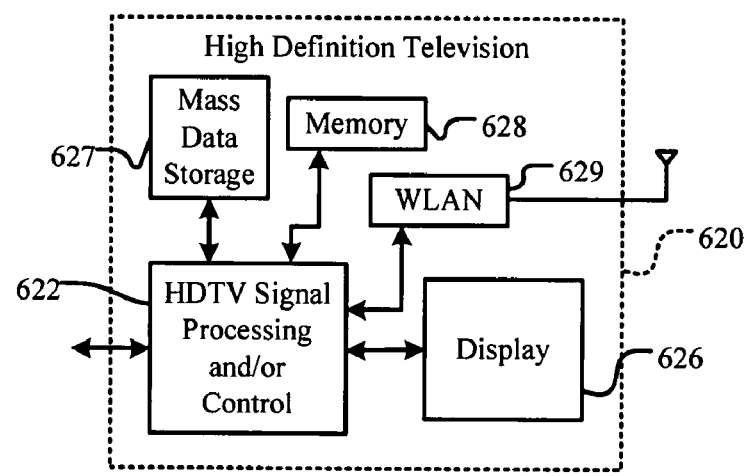
FIG. 6C is a diagram of an exemplary high definition television (HDTV).

Referring now to FIG. 6C, the present invention can also be implemented in an IC for a high definition television (HDTV) 620. The IC may include either or both signal processing and/or control circuits, which are generally identified in FIG. 6E at 622, a WLAN network interface 629 and/or mass data storage system 627 of the HDTV 620. The HDTV 620 receives HDTV input signals in either a wired or wireless format and generates HDTV output signals for a display 626. In some implementations, signal processing circuit and/or control circuit 622 and/or other circuits (not shown) of the HDTV may process data, perform coding and/or encryption, perform calculations, format data and/or perform any other type of HDTV processing that may be required.

The HDTV 620 may communicate with a mass data storage 627 that stores data in a nonvolatile manner, such as optical and/or magnetic storage devices. At least one such optical and/or magnetic storage device may comprise the HDD 600 and/or DVD 610 described above and shown in FIGS. 6A-6B, respectively. The HDD may be or comprise a mini HDD that includes one or more platters having a diameter that is smaller than approximately 1.8". The HDTV 620 may be connected to a memory 628 such as RAM, ROM, nonvolatile memory such as flash memory and/or other suitable electronic data storage. The HDTV 620 also may support connections with a WLAN via a WLAN network interface 629.

Figure 6D:
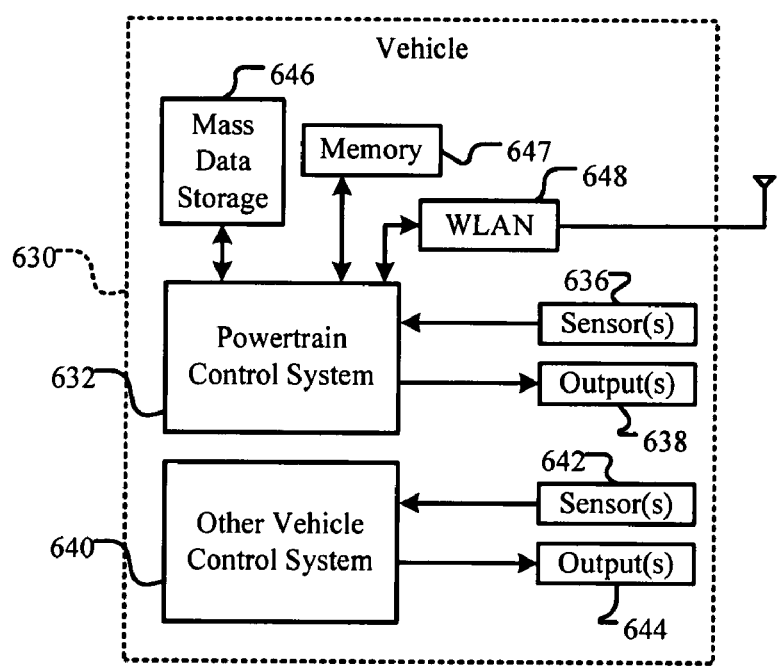
FIG. 6D is a diagram of an exemplary vehicle control system.

Referring now to FIG. 6D, the embodiments of the present invention can also be implemented in an IC for a control system 630 of a vehicle, a WLAN network interface 648, and/or mass data storage system 646 of the vehicle control system. In some implementations, the embodiments of the present invention are implemented in a powertrain control system 632 that receives inputs from one or more sensors 636 such as temperature sensors, pressure sensors, rotational sensors, airflow sensors and/or any other suitable sensors and/or that generates one or more one or more output control signals such as engine operating parameters, transmission operating parameters, and/or other control signals to output devices 638.

The embodiments of the present invention may also be implemented in other control systems 640 of the vehicle 630. The control system 640 may likewise receive signals from input sensors 642 and/or output control signals to one or more output devices 644. In some implementations, the control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 632 may communicate with mass data storage 646 that stores data in a nonvolatile manner. The mass data storage 646 may include optical and/or magnetic storage devices (for example, hard disk drives [HDDs] and/or DVDs. At least one HDD may have the configuration shown in FIG. 6A and/or at least one DVD may have the configuration shown in FIG. 6B. The HDD may be or comprise a mini HDD that includes one or more platters having a diameter that is smaller than approximately 1.8". The powertrain control system 632 may be connected to memory 647 such as RAM, ROM, nonvolatile memory such as flash memory and/or other suitable electronic data storage. The powertrain control system 632 also may support connections with a WLAN via a WLAN network interface 648. The control system 640 may also include mass data storage, memory and/or a WLAN interface (all not shown).

Figure 6E:
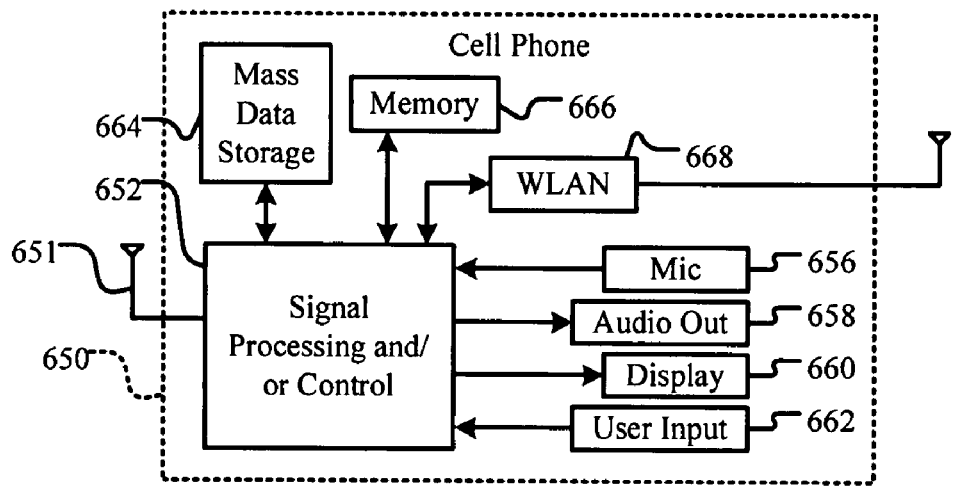
FIG. 6E is a diagram of an exemplary cellular or mobile phone.

Referring now to FIG. 6E, the embodiments of the present invention can be implemented in a cellular phone 650 that may include a cellular antenna 651. The embodiments may include either or both signal processing and/or control circuits, which are generally identified in FIG. 6E at 652, a WLAN network interface 668 and/or mass data storage 664 of the cellular phone 650. In some implementations, the cellular phone 650 includes a microphone 656, an audio output 658 such as a speaker and/or audio output jack, a display 660 and/or an input device 662 such as a keypad, pointing device, voice actuation and/or other input device. The signal processing and/or control circuits 652 and/or other circuits (not shown) in the cellular phone 650 may process data, perform coding and/or encryption, perform calculations, format data and/or perform other cellular phone functions.

The cellular phone 650 may communicate with mass data storage 664 that stores data in a nonvolatile manner, such as optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 650 may include or be connected to memory 666 such as RAM, ROM, nonvolatile memory such as flash memory and/or other suitable electronic data storage. The cellular phone 650 also may support connections with a WLAN via a WLAN network interface 668.

Figure 6F:
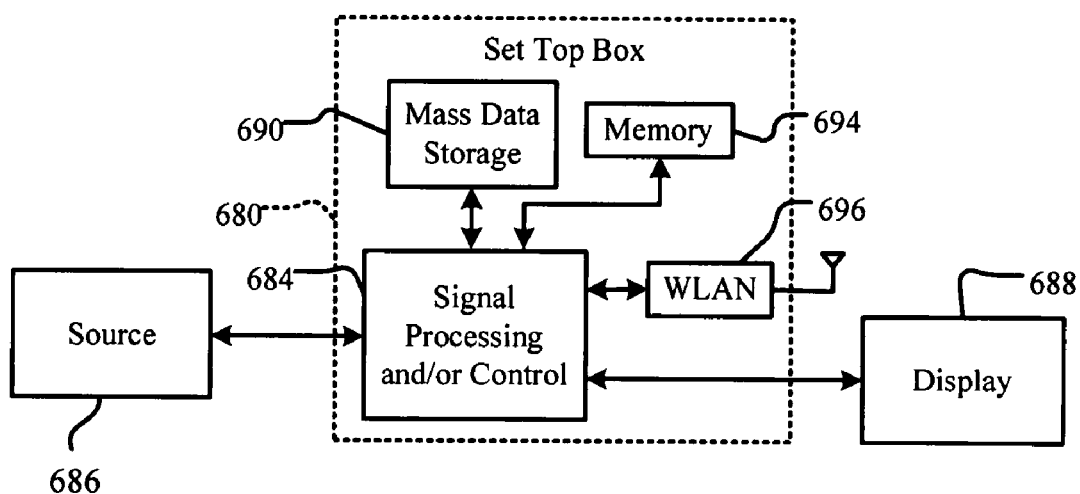
FIG. 6F is a diagram of an exemplary television set top box.

Referring now to FIG. 6F, the embodiments of the present invention can be implemented in an IC for a set top box 680. The embodiments may include either or both signal processing and/or control circuits, which are generally identified in FIG. 6F at 684, a WLAN interface 696 and/or mass data storage 690 of the set top box 680. The set top box 680 receives signals from a source 686 (such as a broadband source) and outputs standard and/or high definition audio/video signals suitable for a display 688 (such as a television and/or monitor and/or other video and/or audio output devices). The signal processing and/or control circuits 684 and/or other circuits (not shown) of the set top box 680 may process data, perform coding and/or encryption, perform calculations, format data and/or perform any other set top box function.

The set top box 680 may communicate with mass data storage 690 that stores data in a nonvolatile manner. The mass data storage 690 may include optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 680 may be connected to memory 694 such as RAM, ROM, nonvolatile memory such as flash memory and/or other suitable electronic data storage. The set top box 680 also may support connections with a WLAN via a WLAN network interface 696.

Figure 6G:
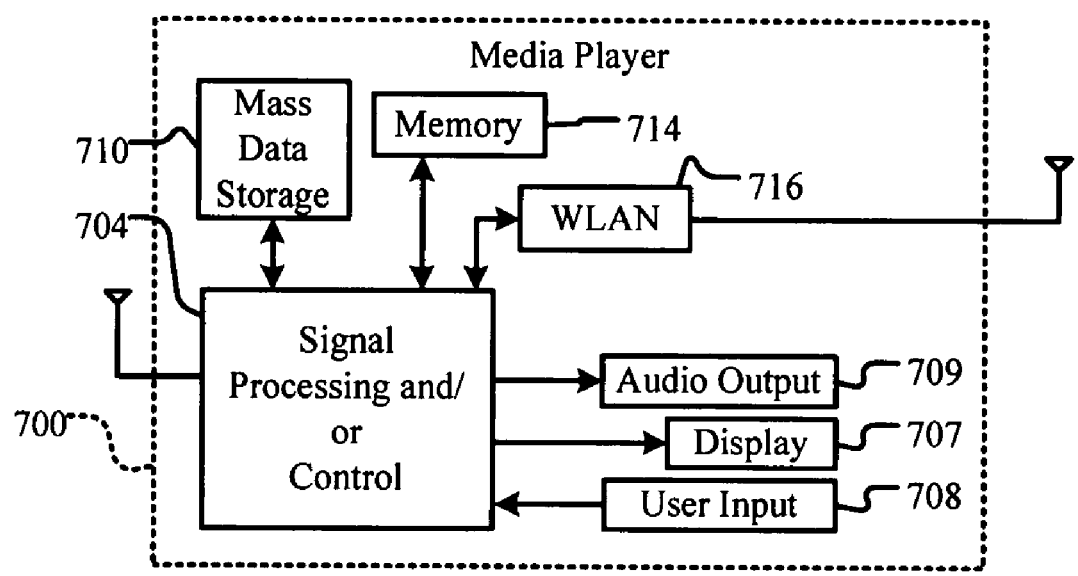
FIG. 6G is a diagram of an exemplary portable media player.

Referring now to FIG. 6G, the embodiments of the present invention can be implemented in an IC for a media player 700. The embodiments may implement either or both signal processing and/or control circuits, which are generally identified in FIG. 6G at 704, a WLAN interface 716 and/or mass data storage 710 of the media player 700. In some implementations, the media player 700 includes a display 707 and/or a user input 708 such as a keypad, touchpad and the like. In some implementations, the media player 700 may employ a graphical user interface (GUI) that typically employs menus, drop down menus, icons and/or a point-and-click interface via the display 707 and/or user input 708. The media player 700 further includes an audio output 709 such as a speaker and/or audio output jack. The signal processing and/or control circuits 704 and/or other circuits (not shown) of the media player 700 may process data, perform coding and/or encryption, perform calculations, format data and/or perform any other media player function.

The media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 700 may be connected to memory 1014 such as RAM, ROM, nonvolatile memory such as flash memory and/or other suitable electronic data storage. The media player 700 also may support connections with a WLAN via a WLAN network interface 716. Still other implementations in addition to those described above are contemplated.

CONCLUSION/SUMMARY

Thus, the embodiments of the present invention include a circuit, systems, and methods for protecting an integrated circuit device from electrostatic discharge (ESD) events, where the integrated circuit device has a first power rail and a second power rail. The ESD protection circuit generally comprises an ESD shunt device coupled to the first power rail and a ground potential, a bias circuit configured to provide a bias voltage to the ESD shunt device during a normal mode of operation and to disable the bias voltage during an ESD event on the first power rail, and an isolation circuit configured to isolate the second power rail from the ESD shunt device during the normal mode of operation and to couple the second power rail to the ESD shunt device during an ESD event on the second power rail. The present invention advantageously provides ESD protection that can be shared by independent power supply rails with minimal current leakage through the ESD device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electrostatic discharge (ESD) protection circuit in a circuit, wherein said circuit has a first power rail and a second power rail, said ESD protection circuit comprising:
an ESD shunt device comprising a first series of diodes and a second series of diodes connected in series, wherein (i) said first power rail is coupled to an input node of said first series of diodes, (ii) an output node of said first series of diodes is coupled to an input node of said second series of diodes at an internal node of said ESD shunt device, and (iii) an output node of said second series of diodes is coupled to a ground potential;
a bias circuit configured to (i) provide a bias voltage to said internal node of said ESD shunt device during a normal mode of operation, and (ii) disable said bias voltage during an ESD event on said first power rail; and
an isolation circuit configured to (i) isolate said second power rail from said ESD shunt device during said normal mode of operation, and (ii) couple said second power rail to said ESD shunt device during an ESD event on said second power rail.

2. The circuit of claim 1, wherein said first series of diodes and said second series of diodes comprise P+/N-well diodes.

3. The circuit of claim 1, wherein said bias circuit comprises:
a bias transistor;
a first resistor coupled to said first power rail and to a gate of said bias transistor; and
a first capacitor coupled to said gate of said bias transistor and to a ground potential.

4. The circuit of claim 3, wherein said bias transistor comprises:
a first source/drain region coupled to said second power rail; and
a second source/drain region coupled to said internal node of said ESD shunt device.

5. The circuit of claim 1, wherein said isolation circuit is further configured to couple said second power rail to said internal node of said ESD shunt device during the ESD event on said second power rail.

6. The circuit of claim 5, wherein said isolation circuit comprises:
an isolation transistor;
an inverter having an output coupled to a gate of said isolation transistor;
a second resistor coupled to said second power rail and to an input of said inverter; and
a second capacitor coupled to said input of said inverter and to the ground potential.

7. The circuit of claim 6, wherein said isolation transistor comprises:
a first source/drain region coupled to said second power rail; and
a second source/drain region coupled to said internal node of said ESD shunt device.

8. A circuit comprising:
the ESD protection circuit of claim 1;
said first power rail; and
said second power rail.

9. The circuit of claim 8, further comprising a first power rail terminal coupled to said first power rail and a second power rail terminal coupled to said second power rail.

10. The circuit of claim 9, wherein said terminals comprise bond pads.

11. The circuit of claim 9, wherein said first power rail terminal is coupled to a first external power supply and said second power rail terminal is coupled to a second external power supply.

12. The circuit of claim 8, wherein:
said first power rail has a voltage potential of approximately 3.3 v during said normal mode of operation; and
said second power rail has a voltage potential of approximately 1.8 v during said normal mode of operation.

13. The circuit of claim 8, wherein the circuit is an integrated circuit.

14. The circuit of claim 1, wherein said first series of diodes comprises four serially connected diodes.

15. The circuit of claim 14, wherein said second series of diodes comprises four serially connected diodes.

16. The circuit of claim 1, wherein said first series of diodes and said second series of diodes together have an effective clamped voltage of approximately 5 to 6 v.

17. The circuit of claim 14, wherein said second series of diodes has an effective clamped voltage of approximately 3 to 4 v.

18. A method of protecting a circuit from electrostatic discharge (ESD) events, wherein said circuit has a first power rail and a second power rail, said method comprising:
providing a bias voltage to an internal node of an ESD shunt device during a normal mode of operation, said ESD shunt device comprising a first series of diodes and a second series of diodes connected in series, wherein (i) said first power rail is coupled to an input node of said first series of diodes, (ii) an output node of said first series of diodes is coupled to an input node of said second series of diodes at said internal node of said ESD shunt device, and (iii) an output node of said second series of diodes is coupled to a ground potential;

during an ESD event on said first power rail, (i) disabling said bias voltage and (ii) shunting ESD current from said first power rail through said ESD shunt device;

isolating said second power rail from said ESD shunt device during said normal mode of operation; and during an ESD event on said second power rail, (i) electrically coupling said second power rail to said ESD shunt device and (ii) shunting ESD current from said second power rail through said ESD shunt device.

19. The method of claim 18, further comprising detecting said ESD event on said first power rail and disabling said bias voltage in response to said detecting.

20. The method of claim 18, wherein said first series of diodes and said second series of diodes comprise P+/N-well diodes.

21. The method of claim 18, wherein electrically coupling said second power rail to said ESD shunt device comprises electrically coupling said second power rail to said internal node of said ESD shunt device.

22. The method of claim 18, further comprising detecting said ESD event on said second power rail and electrically coupling said second power rail to said ESD shunt device in response to said detecting.

23. The method of claim 18, wherein said first series of diodes comprises four serially connected diodes.

24. The method of claim 23, wherein said second series of diodes comprises four serially connected diodes.

25. The method of claim 18, wherein said first series of diodes and said second series of diodes together have an effective clamped voltage of approximately 5 to 6 v.

26. The circuit of claim 25, wherein said second series of diodes has an effective clamped voltage of approximately 3 to 4 v.

* * * * *